United States Patent
Namikawa et al.

(10) Patent No.: US 6,652,700 B1
(45) Date of Patent: Nov. 25, 2003

(54) ORGANIC ELECTROLUMINESCENCE DEVICE AND METHOD FOR PRODUCING THE SAME

(75) Inventors: Makoto Namikawa, Osaka (JP); Haruo Ioka, Osaka (JP); Eiji Toyoda, Osaka (JP)

(73) Assignee: Nitto Denko Corporation, Osaka (JP)

( * ) Notice: Subject to any disclaimer, the term of this patent is extended or adjusted under 35 U.S.C. 154(b) by 130 days.

(21) Appl. No.: 10/019,561

(22) PCT Filed: Jun. 28, 2000

(86) PCT No.: PCT/JP00/04260
§ 371 (c)(1),
(2), (4) Date: Dec. 31, 2001

(87) PCT Pub. No.: WO01/01735
PCT Pub. Date: Jan. 4, 2001

(30) Foreign Application Priority Data

Jun. 29, 1999 (JP) .............................. 11-182938
Jun. 19, 2000 (JP) ....................... 2000-182513

(51) Int. Cl.⁷ ............................................. B32B 31/28
(52) U.S. Cl. ................ 156/247; 156/275.5; 156/275.7; 156/322; 156/344
(58) Field of Search ............................. 156/247, 275.5, 156/275.7, 322, 344; 313/504; 445/24

(56) References Cited

U.S. PATENT DOCUMENTS

| | | | | |
|---|---|---|---|---|
| 5,466,325 A | * | 11/1995 | Mizuno et al. | 156/344 |
| 5,701,055 A | * | 12/1997 | Nagayama et al. | 313/504 |
| 5,759,336 A | * | 6/1998 | Yamamoto et al. | 156/379.6 |
| 6,120,338 A | * | 9/2000 | Hirano et al. | 445/24 |
| 6,126,772 A | * | 10/2000 | Yamamoto et al. | 156/247 |
| 6,235,144 B1 | * | 5/2001 | Yamamoto et al. | 156/344 |
| 6,436,220 B1 | * | 8/2002 | Toyoda et al. | 156/247 |

FOREIGN PATENT DOCUMENTS

| | | |
|---|---|---|
| JP | 4-345015 | 12/1992 |
| JP | 8-8153 | 1/1996 |
| JP | 9-102393 * | 4/1997 |
| JP | 10-261486 | 9/1998 |
| JP | 11-067455 * | 3/1999 |
| JP | 11-307250 | 11/1999 |
| JP | 2000-68071 | 3/2000 |
| JP | 2002-299050 * | 10/2002 |
| WO | 98/36445 * | 8/1998 |

* cited by examiner

Primary Examiner—Curtis Mayes
(74) Attorney, Agent, or Firm—Sughrue Mion, PLLC

(57) ABSTRACT

The present invention provides a method for producing an organic EL device comprising a step of eliminating a partition wall 3, which has become unnecessary after patterning, from a substrate 1 in a production or an organic electroluminescence device (organic EL device). In particular, it provides a method for producing an organic EL device comprising a step of attaching on the substrate adhesive sheets 6, in particular, an adhesive sheet having an ultraviolet ray curing type pressure sensitive adhesive layer after the patterning, and peeling off the adhesive sheets. According to the method, an organic EL device substantially not containing a partition wall is provided so that the adverse effect of the moisture content and the gas discharged from the partition wall to the device can be prevented, and thus an organic EL device with a long life can be provided.

5 Claims, 2 Drawing Sheets

ORGANIC ELECTROLUMINESCENCE DEVICE AND METHOD FOR PRODUCING THE SAME

This is the National Stage of PCT Application No. PCT/JP00/04260 filed Jun. 28, 2000, the disclosure of which is incorporated herein by reference.

TECHNICAL FIELD

The present invention relates to an organic electroluminescence device (organic EL device) and a production method therefore. More specifically, it relates to a method for patterning an organic EL device to be formed by using a partition wall.

BACKGROUND OF THE INVENTION

An organic EL device has an image display array comprising a plurality of light emitting elements comprising light emitting parts of colors, such as red, green, and blue, disposed like a matrix, with each thereof elongating in the stripe direction. In a general schematic structure thereof, first electrodes made of an ITO (indium tin oxide) are arranged parallel with each other like a plurality of stripes on a transparent substrate made of, for example, a glass. Moreover, a plurality of partition walls having an electric insulation property are formed orthogonal to the first electrodes by patterning by a predetermined distance. An organic EL medium is formed on the first electrodes without formation of the partition walls, at least by one layer. Second electrodes are formed on the organic EL medium layer along the elongation direction thereof.

The organic EL medium layer is formed while being sectioned by a deposition mask punched out in a predetermined pattern, and a partition wall. The second electrode on each organic EL medium layer is formed by deposition of a metal with a low resistivity such as an Al, a CU, an Au, and an Mg so as to prevent short circuit of adjacent ones by each partition wall.

However, the above-mentioned partition wall material, is in general, an organic substance with a relatively high water absorbing property such as a photo resist, capable of forming the cross-section in an over hanging shape, such as an inverse trapezoid. Due to the water absorbing property and the umolecular structure thereof, the photo resist tends to discharge a moisture content or an organic gas particularly in a high temperature. A problem is involved in that these deteriorate the organic EL medium, for example, form a non-light emitting part.

In view of the circumstances, an object of the present invention is to provide a method for producing an organic EL device with along life, by preventing an adverse effect to the device of the moisture content and the gas discharged from the partition wall by eliminating the partition wall, which has become unnecessary after patterning, from the substrate. Moreover, an object of the present invention is to provide an organic EL device produced by the above-mentioned method, characterized by containing substantially no partition wall.

DISCLOSURE OF THE INVENTION

In the present invention, as a method for eliminating apartitionwall, which has become unnecessary, from a substrate, an ashing method (dry purification) by an oxygen plasma, or an UV ozone can be used. However, as a result of the elaborate discussion for the above-mentioned objects, the present inventors have found out a further preferable method that unnecessary layers including the partition wall, which has become unnecessary, can be adhered and eliminated easily from the substrate without damaging the organic EL medium as well as the source of generating the moisture content and the organic gas, which deteriorate the organic EL medium can be eliminated by attaching adhesive sheets on the substrate after formation of the second electrode, and peeling off the adhesive sheets.

That is, the present invention relates to a method for producing an organic electroluminescence device, comprising at least a first electrode provided on a base material, an organic EL medium layer provided on the first electrode, and a second electrode provided on the organic EL medium layer, substantially not containing a partition wall, comprising the steps of providing a partition wall on a substrate, and eliminating unnecessary layers from the substrate including the partition wall, characterized in that the step of eliminating the unnecessary layers is a step of attaching the adhesive sheets having the pressure sensitive adhesive layer on the substrate after the patterning on the unnecessary layers including the partition wall so as not to contact with the organic EL medium layer between the partition walls or the second electrode, and peeling off the adhesive sheets, a production method, wherein a pressure sensitive adhesive layer provided in the adhesive sheets for adhering and eliminating the unnecessary layers is an ultraviolet ray curing type, a production method of peeling off the adhesive sheets after a curing process of the ultraviolet ray curing type pressure sensitive adhesive layer, a production method with the above-mentioned configuration, wherein the substrate and/or the unnecessary layers are preheated at the time of attaching the adhesive sheets on the substrate, and a production method with the above-mentioned configuration, wherein the substrate and/or the unnecessary layers are heated after attaching the adhesive sheets on the substrate, and peeling off the adhesive sheets while maintaining the heated state.

In the present invention, the unnecessary layers denote constituents, which become unnecessary in the production steps of the organic EL device. For example, not only a partition wall after patterning, but also an organic EL layer and an electrode may be included in some cases.

BEST MODE FOR CARRYING OUT THE INVENTION

Hereinafter, embodiments of the present invention will be explained with reference to the drawings, but the present invention is not limited thereto.

Figure 1A:
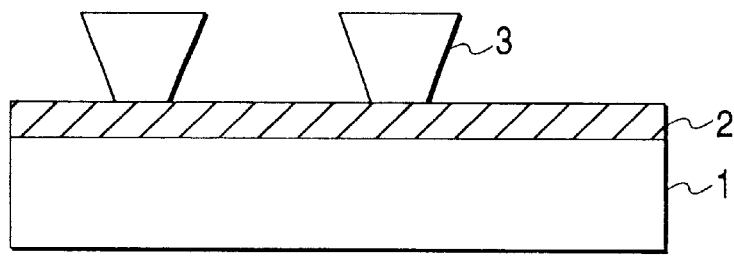
FIGS. 1A to 1D are sectional views showing steps of a production process for an organic EL device according to the present invention.
Figure 1B:
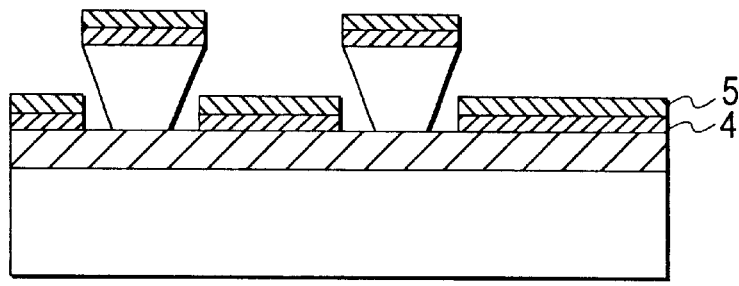

First, in FIG. 1A, first electrodes comprising a transparent conductive thin film of an ITO, or the like, are formed on a transparent substrate 1 of a glass, or the like. The first electrodes 2 are disposed like a plurality of stripes parallel with each other. Moreover, partition walls 3 of a photo resist are formed so as to be arranged by a predetermined interval so as to be orthogonal to the first electrodes 2.

Figure 2A:
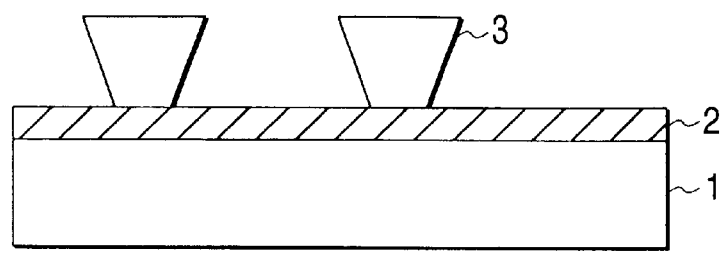
FIGS. 2A, 2B, 2E, 2F are sectional views showing steps of another production process for an organic EL device according to the present invention.
Figure 2B:
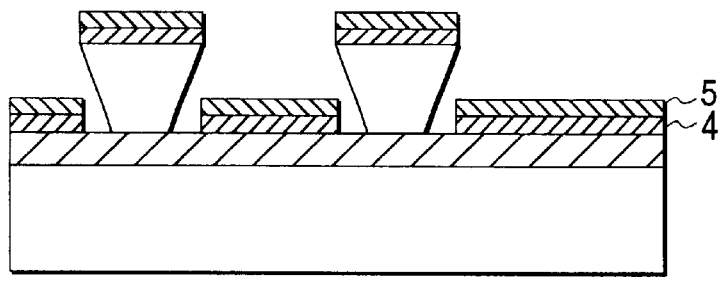

Next, as shown in FIG. 2B, a thin film of an organic EL medium is formed on the entire surface so as to produce an organic EL layer 4. In this case, it is possible either to form the same substance on the entire surface, or to form substances corresponding to, for example, light emitting colors, such as red, green and blue, sectioned by a deposition mask punched out in a predetermined pattern.

Next, a metal having a low resistivity, ouch as an Al, a Cu, an Au, and an Mg, is deposited thereon so as to form a second electrode 5.

Figure 1C:
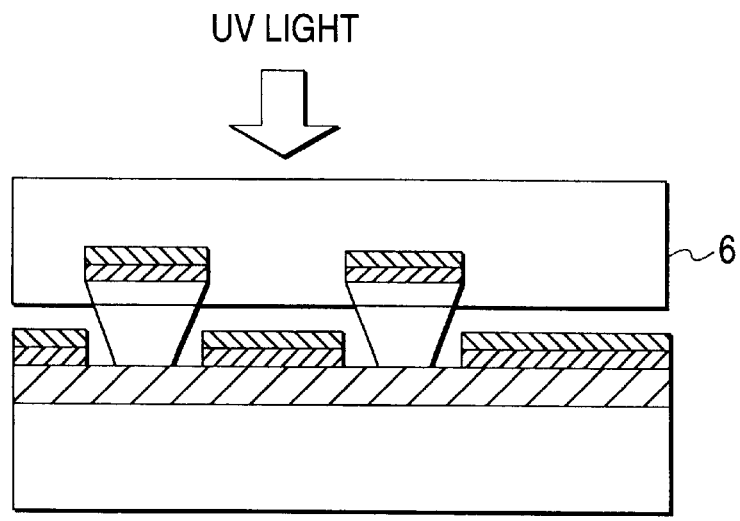
Figure 1D:
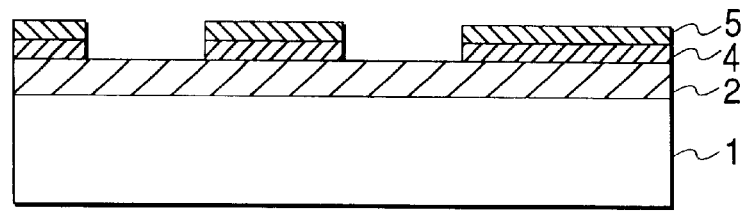

Next, as shown in FIG. 1C, an adhesive sheet 6 is attached on the partition walls 3 such that it does not contact with the organic EL layer 4 or the second electrode 5. At the time, the substrate may be heated. Thereafter, an ultraviolet ray is directed from the adhesive sheet side. After the ultraviolet ray irradiation, as shown in FIG. 1D, the adhesive sheet 6 is peeled off from the substrate. At the time, the unnecessary layers such as the partition wall, and the organic EL layer, the electrode substance, or the like, formed thereon, can be adhered on the adhesive sheet 6 so as to be eliminated from the substrate.

Figure 2E:
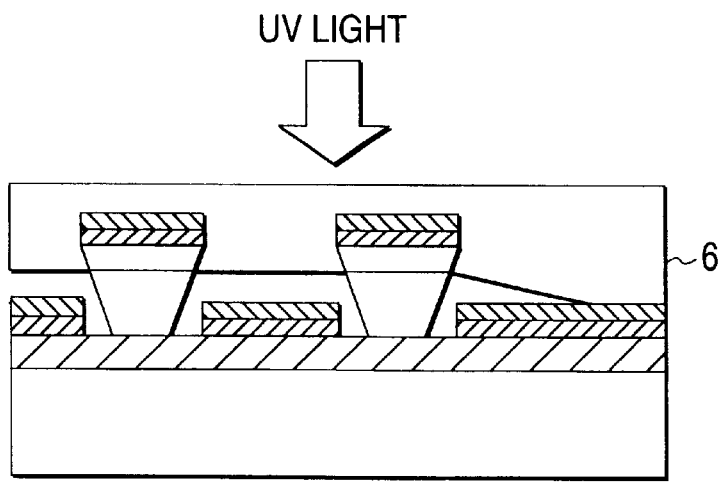
Figure 2F:
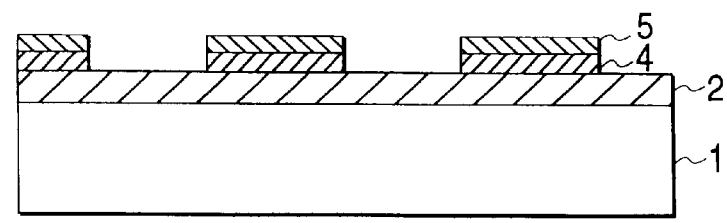

Moreover, in the present invention, as shown in FIG. 2, after the same steps as the above-mentioned A and B, it is also possible to attach the adhesive sheet 6 on the partition walls 3 as well as on the end part of the organic EL layer 4 and the second electrode 5 for eliminating the same as the unnecessary layers as shown in FIG. 2E. An open part of the first electrodes accordingly formed (see FIG. 2F) can be used as a portion for taking out the electrodes at the time of forming a device.

The step of peeling off the partition walls by the adhesive sheet 6 is not limited to once, but it may be executed by as many times as needed. For example, as another step after eliminating the partition walls 3, a part of the organic EL layer 4 and the second electrodes 5 may be eliminated.

An organic EL device produced as mentioned above comprises at least a first electrode provided on a substrate, an organic EL medium layer provided on the first electrode, and a second electrode provided on the organic EL medium layer, characterized by substantially not containing a partition wall. As needed, it may be covered with a protective film, or another process may be executed without departing from the scope of the function as the EL device.

As an organic EL medium, a photo resist, or the like, used in the present invention, those conventionally known can be used optionally.

Adhesive sheets used in the present invention are produced by providing a pressure sensitive adhesive layer on a film base material and as needed a protective film thereon, and processed into a sheet-like or tape-like shape. The above-mentioned film base material is not particularly limited, but for example, a polyolefin, a polyester, an acetyl cellulose, a polycarbonate, a polyamide, or the like, can be presented. The thickness thereof is, in general, about 10 to 100 μm.

The pressure sensitive adhesive layer may be one using an ordinary acrylic based or rubber based non-curing type pressure sensitive adhesive, but in order to peel off the resist material, or the like, further neatly without leaving the adhesive remained, one using a curing type pressure sensitive adhesive is preferable. Moreover as an active energy source used for curing the pressure sensitive adhesive, an ultraviolet ray, heat, or the like, can be presented, but in terms of preventing the operation error derived from the unintentional external heat, the ultraviolet ray is preferable.

As the ultraviolet ray curing type pressure sensitive adhesive, the material, or the like, thereof is not particularly limited as long as a property of being cured by the ultraviolet ray irradiation so as to have a three-dimensionally net-like molecular structure. For example, polymerization curing type ones containing a curing compound having one or more unsaturated double bond in a molecule, and a polymerization initiator in a pressure sensitive adhesive polymer are preferable.

As the pressure sensitive adhesive polymer, for example, a (meth) acrylic acid selected from the group consisting of an acrylic acid, an acrylate, a methacrylicacid, and a methacrylate, and/or an acrylic polymer containing a (meth) acrylate as the principal monomer, can be presented. In synthesizing the acrylic polymer, by introducing an unsaturated double bond in the molecule of the acrylic polymer by using a compound having two or more unsaturated double bonds in the molecule as a copolymerization monomer, or chemically bonding a compound having an unsaturated double bond in the molecule with the acrylic polymer after the zynthesis by the reaction between the functional groups, or the like, the polymer itself can be related with the polymerization curing reaction by the active energy. The pressure sensitive adhesive polymer can be produced by a known method.

The weight average molecular weight of the pressure sensitive adhesive polymer used in the present invention is, in general, 100,000 to 1,000,000, preferably 2,000,000 to 8,000,000. Here, as the curing compound having one or more unsaturated double bond in the molecule, unvolatile one with a low molecular weight of a 10,000 or less weight average molecular weight is preferable, in particular, one having a 5,000 or less molecular weight so as to efficiently have a pressure sensitive adhesive layer into a three-dimensionally net-like structure at the time of curing. Specifically, for example, a urethane (meth) acrylate, an oligoester (meth) acrylatet an epoxy (meth) acrylate, a polyethylene glycol di(meth) acrylate, a trimethylol propane tri (meth) acrylate, or the like, can be presented. The amount of adding the curing compound is, in general, 20 to 200 parts by weight, preferably 50 to 150 parts by weight with respect to 100 parts by weight of the pressure sensitive adhesive polymer.

Moreover, the polymerization initiator to be added in the pressure sensitive adhesive is not particularly limited, and those known can be used. For example, photo polymerization initiators, such as benzoyls, a benzoin ethyl ether, a dibenzyl, an isopropyl benzoin ether, a benzophenone, a Michler's ketone chlorothioxantone, dodecyl thioxantone, adimethyl thioxantone, an acetophenone diethyl ketal, a benzyl dimethyl ketal, an α-hydroxy cyclohexyl phenyl ketone, a 2-hydroxydimethyl phenyl propane, and a 2,2-dimethoxy-2-phenyl acetophenone, can be presented. The amount of adding the polymerization initiator is, in general, 0.1 to 10 parts by weight, preferably 0.5 to 8 parts by weight with respect to 100 parts by weight of the pressure sensitive adhesive polymer.

Furthermore, to the pressure sensitive adhesive, other additive, such as a cross-linking agent, and an adhesion providing agent may be added within a scope not deteriorating the ultraviolet ray curing function. The total amount of the additives other than the above-mentioned is, in general, 50 parts y weight or less with respect to 100 parts by weight of the pressure sensitive adhesive polymer.

Moreover, the thickness of the pressure sensitive adhesive layer is preferably, in general, about 5 to 200 μm.

As the protective film, for example, a polyolefin, a polyester, an acetyl cellulose, a polycarbonate, a polyamide, or the like, can be presented. A film with about a 12 to 200

μm can be used. As the film, in order to provide a separator function, those optionally having a mold release process on the contact surface with the pressure sensitive adhesive layer are preforable.

In the present invention, the adhesive sheets are attached on the substrate after patterning, and in the case the pressure sensitive adhesive layer of the adhesive sheets is made of a curing type pressure sensitive adhesive, the adhesive sheets are peeled off after applying a predetermined curing process, for peeling off and eliminating from the substrate the unnecessary layers including at least the partition walls attached therewith so as to form an EL device. The ultraviolet ray irradiation amount at the time of the curing process is, in general, 50 to 2,000 mJ/cm$^2$.

Here, as to the adhesive sheets having the pressure sensitive adhesive layer made of the curing type pressure sensitive adhesive, the close contact property between the adhesive sheets and the unnecessary layers can be improved for facilitating adhesion by preheating the substrate and/or the unnecessary layers at the time of attaching the adhesive sheets on the substrate, and thus it is preferable. The heating temperature for the substrate and/or the unnecessary layers is, in general, 120° C. or less, preferably 70° C. or less (in general, a room temperature or more). Moreover, it is also preferable to peel off the adhesive sheets in the state the substrate and/or the unnecessary layers being heated so as to lower the elastic modulus of the resist material. The heating temperature at the time is also, in general, 120° C. or less, preferably 70° C. or less (in general, a room temperature or more).

According to the heating operation, since the elastic modulus of the partition walls made of the resist material, which are the unnecessary layers, is in the lowered state, the adhesion sate of the resist material with respect to the substrate is improved so that the close contact state onto the substrate surface is deteriorated, and thus by the peeling operation of the adhesive sheets attached thereto, the resist material can easily be peeled off and eliminated from the substrate. At the time, regardless of the thickness and the property of the resist material, a preferable peeling and eliminating property can be achieved certainly.

Specifically, a method of attaching the adhesive sheets with the substrate and/or the unnecessary layers in the preheated state, and peeling off with the heated state maintained, a method of heating the substrate and the unnecessary layers after attaching the adhesive sheets, and peeling off with the heated state maintained, or the like, can be presented.

In these methods the heating temperature for the substrate and the unnecessary layers can be a temperature without the risk of deteriorating or denaturing the used organic EL medium.

EXAMPLES

Hereinafter, the present invention will be explained with reference to examples, but the present invention is not limited thereto. Hereinafter, apart denotes apart by weight.

Reference Example 1

An acrylic based polymer having a 700,000 weight average molecular weight was obtained from 75 parts of a 2-ethyl hexyl acrylate, 20 parts of a methyl acrylate, and 5 parts of an acrylic acid. 50 parts of a polyethylene glycol dimethacrylate, 50 parts of a urethane acrylate, 3 parts of a benzyl dimethyl ketal, and 3 parts of a diphenyl methane diisocyanate with respect to 100 parts of the acrylic based polymer were mixed homogeneously so as to provide an ultraviolet ray curing type pressure sensitive adhesive solution.

The ultraviolet ray curing type pressure sensitive adhesive solution was coated on one side of a 50 μm thickness polyester film so as to have a 35 μm thickness after drying. It was dried at 120° C. for 5 minutes. By attaching a 38 μm thickness polyester peeling film on the surface thereof as the protective film, an adhesive sheet was produced.

Reference Example 2

A glass plate with an ITO was used as a substrate. A positive type photo resist was spin coated on the entire surface of the substrate so as to have a 2 μm thickness after drying, and dried at 80° C. for 1 minute. Then, after patterning in an ordinary photolithography technique for forming a partition wall, an organic EL medium was formed on the substrate entire surface. An Mg was formed on the upper surface thereof by deposition by 0.1 μm so or Lo provide a second electrode.

Example 1

After peeling off the protective film from the adhesive sheet obtained by the method of the reference example 1, the adhesive sheet was attached to the substrate produced in the reference example 2 onto the partition wall comprising the photo resist without contacting with the second electrode. After directing a high pressure mercury lamp light by 460 mJ/cm$^2$ from the sheet upper surface, the sheet was peeled off from the substrate so that only the patterned portion in the resist was peeled off from the interface between the resist and the substrate integrally with the sheet. In the portion without the resist, both Mg/organic EL layer existed on the ITO.

Example 2

The substrate and the unnecessary layers produced in the reference example 2 were heated to 50° C. After peeling off the protective film from the adhesive sheet obtained by the method of the reference example 1, it was attached to the partition wall and a part of the second electrode/organic EL layer. After directing a high pressure Hg lamp light by 460 mJ/cm$^2$ from the sheet upper surface while maintaining the heated state, the sheet was peeled off from the substrate so that only the patterned portion in the resist and the part of the second electrode/organic EL layer attached with the adhesive sheet were peeled off from the interface between the resist and the substrate integrally with the sheet. In the portion without the resist, both Mg/organic EL layer existed on the ITO.

Industrial Applicability

Since the partition wall having the risk of deteriorating the organic EL medium can be eliminated according to the present invention without deterioration of the organic EL medium, an organic EL device having a life longer than the conventional ones can be realized easily.

What is claimed is:

1. A method for producing an organic electroluminescence device, comprising at least a first electrode provided on a base material, an organic electroluminescence medium layer provided on the first electrode, and a second electrode provided on the organic electroluminescence medium layer, substantially not containing a partition wall, comprising the steps of providing a partition wall on a substrate, and eliminating unnecessary layers from the substrate including the partition wall, characterized in that the step of eliminating the unnecessary layers is a step of attaching the adhesive sheets having the pressure sensitive adhesive layer on the substrate after the patterning on the unnecessary layers including the partition wall so as not to contact with the organic EL medium layer between the partition walls or the second electrode, and peeling off the adhesive sheets.

2. The method for producing an organic electroluminescence device according to claim 1, a production method, characterized in that the pressure sensitive adhesive layer provided in the adhesive sheets is an ultraviolet ray curing type.

3. The method for producing an organic electroluminescence device according to claim 2, characterized in that the adhesive sheets are peeled off after applying a curing process to the pressure sensitive adhesive layer of the adhesive sheets.

4. The method for producing an organic electroluminescence device according to claim 3, characterized in that the substrate and/or the unnecessary layers are preheated at the time of attaching the adhesive sheets on the substrate.

5. The method for producing an organic electroluminescence device according to claim 4, characterized in that the substrate and/or the unnecessary layers are heated after attaching the adhesive sheets on the substrate, and peeling off the adhesive sheets while maintaining the heated state.

* * * * *